United States Patent [19]
Zehavi et al.

[11] Patent Number: 6,118,826
[45] Date of Patent: *Sep. 12, 2000

[54] METHOD AND APPARATUS FOR ENCODING/DECODING QAM TRELLIS CODED DATA

[75] Inventors: Ephraim Zehavi, Del Mar; Jack Keil Wolf, Rancho Mirage, both of Calif.

[73] Assignee: QUALCOMM Incorporated, San Diego, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/895,146

[22] Filed: Jul. 16, 1997

Related U.S. Application Data

[63] Continuation of application No. 08/709,610, Sep. 9, 1996, Pat. No. 5,848,102.

[51] Int. Cl.[7] .............................. H04L 5/12; H04L 23/02
[52] U.S. Cl. ......................... 375/261; 375/265; 371/43.7
[58] Field of Search ...................................... 375/261, 265, 375/262, 295, 298; 371/46, 43.2, 43.4, 43.6, 43.7

[56] References Cited

U.S. PATENT DOCUMENTS

| | | | |
|---|---|---|---|
| 5,233,629 | 8/1993 | Paik et al. | 375/261 |
| 5,511,082 | 4/1996 | How et al. | 371/43 |
| 5,633,881 | 5/1997 | Zehavi et al. | 375/308 |
| 5,848,102 | 12/1998 | Zehavi et al. | 375/261 |

*Primary Examiner*—Chi H. Pham
*Assistant Examiner*—Bryan Webster
*Attorney, Agent, or Firm*—Russell B. Miller; Sean English; Brian S. Edmonston

[57] ABSTRACT

A method and apparatus for encoding and decoding QAM trellis modulated data. In the transmitter, a subset of bits of an input bit set are convolutionally encoded based upon a punctured convolutional code of a lower data rate to provide a set of coded symbols. The coded symbols and the uncoded bits of the input bit set are provided to a QAM modulator to provide a QAM modulation signal indicative of the values of coded symbols and the uncoded bits. In the receiver a QAM demodulator converts the received QAM signal to QAM signal space coordinates. A decoder employing the Viterbi algorithm is used to reconstruct a corrected estimate of the values of the coded data bits from the received signal coordinates. The corrected estimate of the values of the coded data bits are then used in conjunction with the received signal coordinates to provide corrected estimates of the values of the uncoded input bits.

5 Claims, 6 Drawing Sheets

METHOD AND APPARATUS FOR ENCODING/DECODING QAM TRELLIS CODED DATA

This is a continuation of application Ser. No. 08/709,610, filed Sep. 9, 1996 now U.S. Pat. No. 5,848,102.

BACKGROUND OF THE INVENTION

I. Field of the Invention

The present invention relates to data communications. More particularly, the present invention relates to a novel and improved method for encoding and decoding QAM (Quadrature Amplitude Modulation) trellis modulated data based upon punctured convolutional codes of a lower data rate.

II. Description of the Related Art

The field of data communications is concerned with raising the data throughput of a transmission system with a limited signal to noise ratio (SNR). The use of error correcting circuitry such as the Viterbi decoder allows system tradeoffs to be made with smaller SNRs or higher data rates to be used with the same bit error rate (BER). The decrease in the SNR needed is generally referred to as coding gain. Coding gain may be determined from bit error performance curves. In a graph of bit error performance curves, the BER of uncoded and various coded data is charted against $E_b/N_o$, where $E_b$ is the energy per bit and $N_o$ is the one sided Gaussian White Noise power spectral density. The coding gain at any point along a bit error performance curve for a particular BER level is determined by subtracting the coded $E_b/N_o$ from the uncoded $E_b/N_o$. In the paper "Viterbi Decoding for Satellite and Space Communication", by J. A. Heller and I. M. Jacobs, IEEE Transactions on Communication Technology, Vol. COM-19, pgs. 835–848, October 1971, extensive results of simulations on various decoder apparatus were reported.

The coding rate and constraint length are used to define the Viterbi decoder. The coding rate (m/n) corresponds to the number of coding symbols produced (n) for a given number of input bits (m). The coding rate of ½ has become one of the most popular rates, although other code rates are also generally used. One class of codes with m≠1 are called punctured codes and are produced by discarding or erasing symbols from the rate 1/n code. The constraint length (K) is related to the length of the convolutional encoder used in the encoding of the data. A constraint length of K=7 is typical in convolutional coding schemes though any constraint length is equally applicable. The convolutional encoder can be thought of as a Finite Impulse Response (FIR) filter with binary coefficients and length K-1. This filter produces a symbol stream with $2^{K-1}$ possible states.

The basic principle of the Viterbi algorithm is to take a convolutionally encoded data stream that has been transmitted over a noisy channel and use the properties of the convolutional code to determine the transmitted bit stream. The Viterbi algorithm is a computationally efficient method of updating the conditional probabilities of all $2^{K-1}$ states and finding the most probable bit sequence transmitted. In order to compute this probability, all the conditional probabilities of $2^{K-1}$ states for each bit must be computed. For a rate ½ code, the resulting decision from each of these computations is stored as a single bit in a path memory.

A chainback operation, an inverse of the encoding operation, is performed in which the $p \cdot 2^{K-1}$ decision bits are used to select an output bit, where p is the path memory depth. After many states the most probable path will be selected with a high degree of certainty. The path memory depth must be sufficiently long to allow this probability to approach 1. For a rate ½ code, an exemplary path memory depth is about (5·K), or 35 states. For a rate ⅞ punctured code the optimal depth increases to 96 states.

Constraint lengths of K less than 5 are too small to provide any substantial coding gain, while systems with K greater than 7 are typically too complex to implement as a parallel architecture on a single VLSI device. As the constraint length increases, the number of interconnections in a fully parallel computation section increases as a function of $(2^{K-1} \cdot L)$, where L is the number of bits of precision in the state metric computations. Therefore, where K is greater than 7, serial computation devices are generally used which employ large external random access memories (RAMs).

In the paper "Channel Coding with Multilevel/Phase Signal" by G. Ungerboeck, IEEE Transactions on Information Theory, Vol. IT-28, pgs. 55–67, January 1982, a trellis coded modulation (TCM) was described. In Ungerboeck it was shown that within a given spectral bandwidth, it is possible to achieve an Asymptotic Coding Gain of up to 6 dB by employing a rate (n-1)/n convolutional code and doubling the signal set. Unfortunately for each modulation technique and for each bit rate, the maximal coding gain is achieved by a different convolutional code. Further disclosed were the results of a search for all convolutional codes for several rates and modulation techniques, and the best codes presented.

In the paper "A Pragmatic Approach to Trellis-Coded Modulation" by A. J. Viterbi, J. K. Wolf, E. Zehavi and R. Padovani, IEEE Communications Magazine, pgs. 11–19, July 1989, a pragmatic approach to trellis coded modulation (PTCM) was disclosed. The underlying concept therein is that a somewhat lower coding gain is achievable by a PTCM based on the "industry standard" rate ½, K=7 convolutional code. Although a lower coding gain is realized, it is very close to the coding gain of Ungerboeck at BERs of interest.

Trellis coding is an attractive coding technique since it possesses an aspect which other coding techniques lack. The power of trellis coding lies in the fact that even though no apparent coding operation is performed on some of the bit(s) of the input data, the decoder is able to provide error correction on all bits. Generally the use of TCM techniques to achieve efficient use of power-bandwidth resources has been limited to low speed applications in digital signal processor implementations. The use of PTCM techniques enable VLSI implementations of an encoder/decoder capable of operating at high rates. A decoder using PTCM techniques is capable of handling different modulation techniques, such as M-ary phase-shift keying (M-ary PSK) including Binary PSK (BPSK), Quadrature PSK (QPSK), 8-PSK, and 16-PSK.

In the paper, "Development of Variable-Rate Viterbi Decoder and Its Performance Characteristics," *Sixth International Conference on Digital Satellite Communications*, Phoenix Ariz., September, 1983 Y. Yasuda, Y. Hirata, K. Nakamura and S. Otani discuss a method whereby a class of high rate binary convolutional codes can be constructed from a single lower rate binary convolutional code. The advantage of punctured codes for binary transmission is that the encoders and decoders for the entire class of codes can be constructed easily by modifying the single encoder and decoder for the rate ½ binary convolutional code from which the high rate punctured code was derived. Indeed, many commercial VLSI convolutional encoder and decoder chips (including a device marketed under Part No. Q1875 by QUALCOMM Incorporated of San Diego, Calif.) contain encoders and decoders for punctured binary codes using this de-facto standard rate ½ code.

It is therefore an object of the present invention to provide a novel method and circuitry for encoding and decoding QAM trellis modulation data using punctured rate ½ convolutional encoders.

SUMMARY OF THE INVENTION

The present invention is a novel and improved method and apparatus for encoding and decoding QAM trellis modulated data based upon puncturing a convolutional code of lower data rate. In accordance with the present invention a QAM trellis encoder and decoder are disclosed in which a circuit is provided that encodes and decodes trellis modulated data encoded in accordance with a punctured convolutional code.

In the present invention, a transmitter encodes a bit stream, serial or parallel, according to a predetermined encoding format. In the present invention a subset of bits of an input bit set is provided to a convolutional encoder based upon puncturing the output of a lower data rate convolutional encoder. The output symbols provided by the convolutional encoder and uncoded bits of the input bit set are provided to a QAM modulator and modulated in accordance with a predetermined modulation format. The coding and modulation format is designed to increase redundancy in the transmitted symbols, in such a way that the transmitted signal imbedded with noise can be correctly reconstructed at the receiver by employing a Viterbi decoder which provides estimates of the most likely transmitted data sequence.

In the receiver, the received signal is provided to a QAM demodulator that converts the modulation signal (imbedded with noise) to received signal space coordinates $R_I$ and $R_Q$ representative of the I and Q components of the received signal. The $R_I$ and $R_Q$ symbols are presented to a branch metric calculator. The branch metric calculator calculates, in accordance with the received symbols, metrics that define quantities proportional to the likelihood of alternative hypotheses of the received bit pattern.

The calculated metrics are presented to a decoder that operates with the aid of the Viterbi algorithm to provide a corrected estimate of the coded bits. The received symbols $R_I$ and $R_Q$ are provided to a sector logic element that provides a sector number that defines a subspace of the signal plane in the proximity of the received signal space coordinates. The sector number and the corrected estimates of the coded bits are provided to decision logic to provide an estimate of the uncoded bits.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

Figure 1:
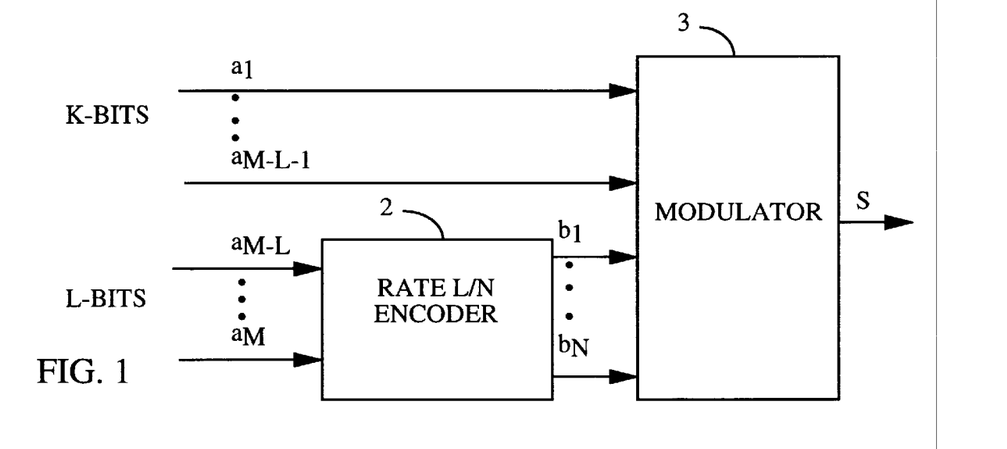
FIG. 1 is an exemplary block diagram of a QAM trellis modulated data transmitter.

Referring to FIG. 1, a general QAM trellis modulator is illustrated. An input bit set consisting of the M input bits $a_1$–$a_M$ is provided to the trellis modulator. Bits $a_{M-L+1}$ through $a_M$ are provided to rate L/N convolutional encoder 2 in which the convolutional encoding is based upon a punctured convolutional encoder of a lower data rate. A constraint length of 7 would be typical in this type of convolutional encoder, though the present invention is equally applicable to any constraint length.

The rate L/N encoder 2 provides N coded symbols $b_1$–$b_N$ in response to the input bits $a_{M-L+1}$–$a_M$. The uncoded input bits $a_{M-L}$ and the N coded symbols $b_1$–$b_N$ are provided to QAM modulator 3, which provides modulation signal S indicative of the values of the uncoded input bits $a_1$–$a_{M-L}$ and the N coded symbols $b_1$–$b_N$.

Figure 2:
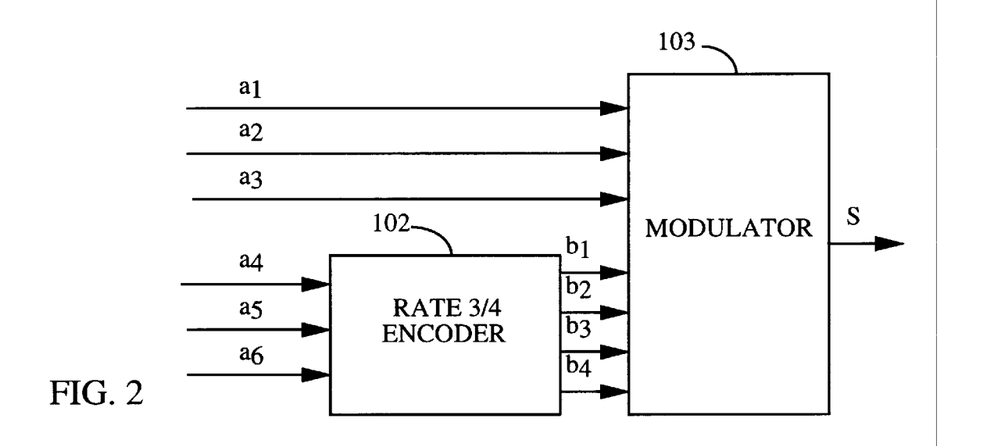
FIG. 2 is an exemplary block diagram of a 128-QAM trellis modulated data transmitter.

Referring to FIG. 2, a specific example of the QAM modulation circuit illustrated in FIG. 1 is disclosed for encoding and modulating data using 128-QAM modulation. The data is presented to the transmitter as 6 parallel sequences of data. Data of any format can be converted to the six parallel format using converters and buffers (not shown) that are well known in the art.

Three bits ($a_4$–$a_6$) of the six bit set ($a_1$–$a_6$) of data are encoded at encoder 102. Encoder 102 is configured as a rate ¾ convolutional encoder based on rate ½ punctured codes. In the exemplary configuration, the 3 bit set ($a_4$–$a_6$) is presented to the encoder 102 and 6 symbols (3 symbol pairs) are internally generated. However, only for one of the generated symbol pairs are both symbols provided from encoder 102. For the remaining two pairs of generated symbols only one symbol of each symbol pair is provided by encoder 102.

In the exemplary embodiment the two most significant symbols ($b_1$ and $b_2$) of the four bit encoded symbol will be provided by rate ½ convolutionally encoding bit $a_4$, the second to least significant symbol ($b_3$) will be provided by selecting one of the two symbols provided by rate ½ convolutionally encoding bit as, and the least significant symbol ($b_4$) will be provided by selecting one of the two symbols provided by rate ½ convolutionally encoding bit $a_6$.

Figure 4:
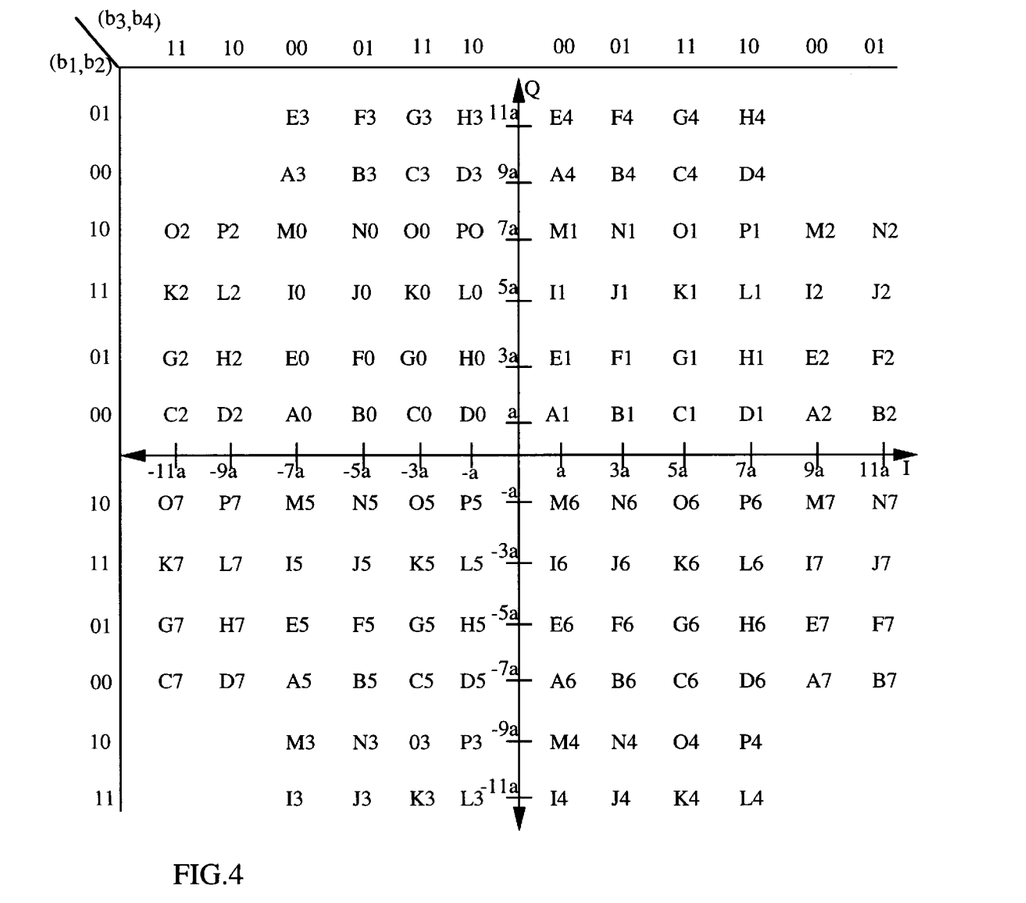
FIG. 4 is an exemplary diagram of a 128-QAM modulation constellation.

The four output symbols ($b_1$–$b_4$) and the three uncoded bits ($a_1$–$a_3$) are presented to modulator 103. Modulator 103 provides the 128-QAM modulation signal S in amplitude and phase representing the values of the four output symbols ($b_1$–$b_4$) and the three uncoded bits ($a_1$–$a_3$). Referring to FIG. 4, the uncoded bits ($a_1$–$a_3$) select a group of signal points, there are eight groups denoted by the numbers 0 through 7, each group containing 16 signal points labeled A–P. The coded symbols select the I and Q coordinates of the signal point within the selected group of signal points. More specifically, the two most significant symbols (b1 and b2) determine the Q-coordinates of the signal point of the selected group and the two least significant symbols (b3 and b4) determine the I-coordinate of the signal point of the selected group.

The conversion of the coded and uncoded bits to the modulation signal S is illustrated by the following example.

In this example the symbols ($b_1$–$b_4$) are of a values 0101 while the uncoded bits ($a_1$–$a_3$) are of a value 101. Since the bits ($a_1$–$a_3$) in a base 8 representation is the number 5 they are used to select the group of signal points represented by A5–P5. With symbols $b_1$–$b_2$ being 01, this value is used to select a row of signal points within the selected group of signal points, ie E5–H5. With symbols $b_3$–$b_4$ being 01, this value is used to select a column of signal points, ie B5, F5, J5 and N5. The intersection of the selected row and column within the selected group of signal points is selected as the modulation signal S, ie. F5.

Figure 3:
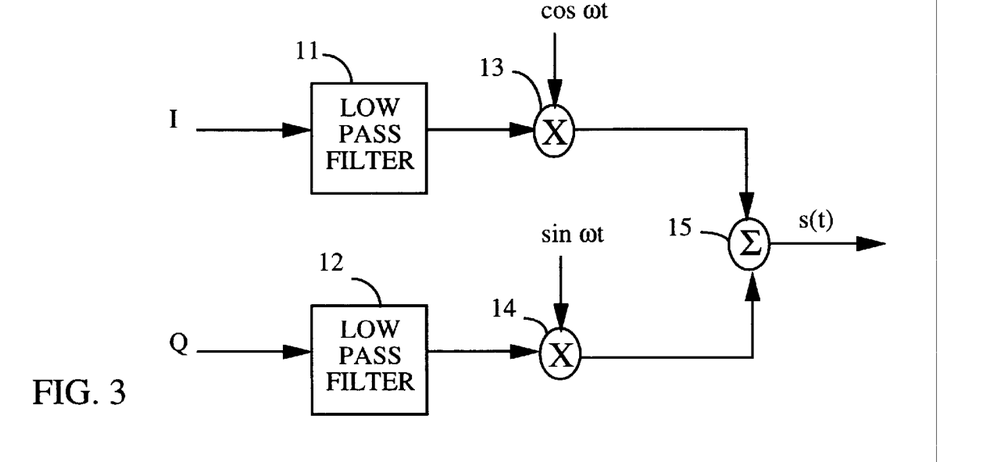
FIG. 3 is a block diagram of a QAM modulator.

FIG. 3 is an exemplary block diagram of a QAM modulator. The data to be modulated, $a_1$–$a_3$ and $b_1$–$b_4$, are mapped into a corresponding coefficient pair (I,Q). In the above example I=–5a and Q=–5a. Each coefficient of the coefficient pairs is passed through low pass filters 11 or 12 to eliminate high frequency transients that come from the signal transitions of signal I and Q. The low passed signals are presented to mixers 13 and 14 where they are mixed or multiplied by the orthogonal signals represented by sin ωt and cos ωt. The mixed signals are then combined at summer 15 and output for transmission as signal s(t).

Again referring to FIG. 4, the I and Q component signal point values are taken from the set {±11a, ±9a, ±7a, ±5a, ±3a, ±a}. Using the usual signal space convention wherein the squared distance of any signal point to the origin is represents the energy of that signal, the average energy ($E_{av}$) of the 128 signals (assuming that they are transmitted with equal apriori probability) can be calculated by equation 1:

$$E_{av} = \frac{1}{128} \sum_{\forall (I,Q)} I^2 + Q^2 \qquad (1)$$

to be 82($a^2$).

Figure 5:
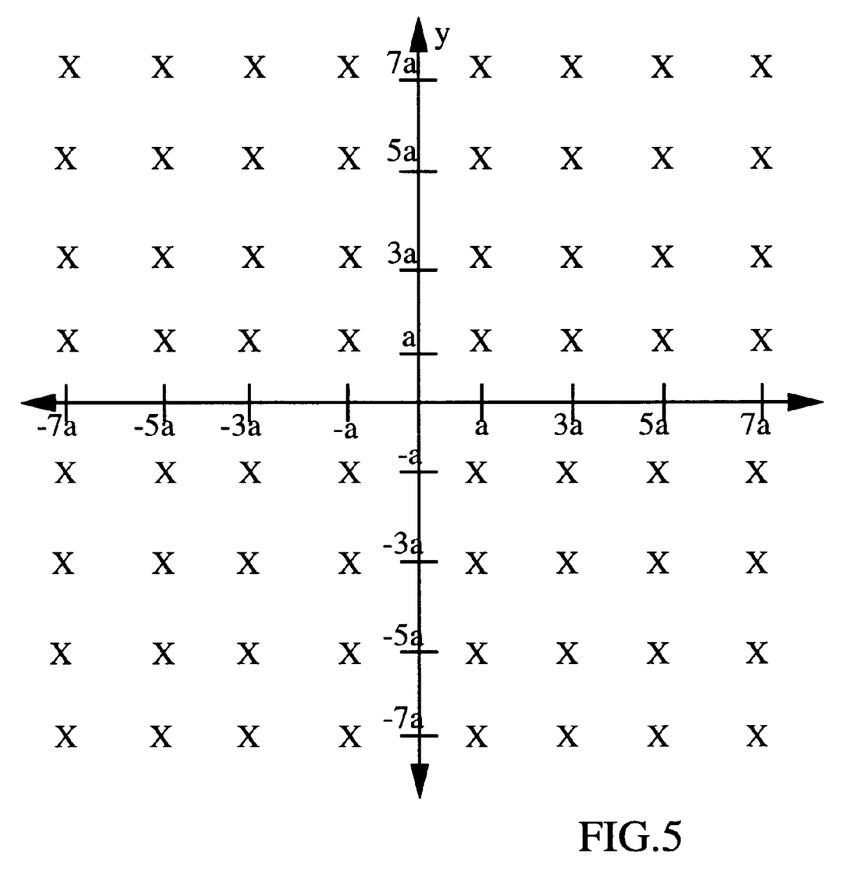
FIG. 5 is an illustration of an uncoded 64-QAM modulation constellation.

Considering as a baseline the uncoded 64 QAM constellation, illustrated in FIG. 5. The signal points of this modulation constellation are placed on the same rectangular grid in an 8×8 square where the I and Q coordinates are taken from the set {±7a, ±5a, ±3a, ±a}. The average energy of these 64 signals (again assuming equal apriori probability) can be calculated according to equation 2:

$$E_{av} = \frac{1}{64} \sum_{\forall (I,Q)} I^2 + Q^2 \qquad (2)$$

to be $42a^2$. The minimum squared Euclidean distance between any two signals is $(2a)^2=4a^2$. Thus the ratio of the minimum squared Euclidean distance to the average signal energy for the uncoded system is 4/42=0.096.

To calculate the minimum distance for the case of trellis coded modulation with parallel transitions on the trellis, both the minimum squared Euclidean distance between two parallel paths in the trellis, denoted $d^2$parallel, and the minimum squared Euclidean distance between any two distinct paths in the trellis that start in a common state and end in a common (but perhaps different) state, denoted $d^2_{trellis}$ must be calculated. Parallel paths in the trellis correspond to signal points with the same letter. Such points have minimum squared Euclidean distance equal to:

$$d^2_{parallel}=(8a)^2=64(a^2) \qquad (3)$$

The trellis itself for the rate ¾ punctured 64 state code has a free Hamming distance of 5. In the exemplary case, the mapping between the 16 letters and the 16 binary 4-tuples produced by convolutional encoder 102 is shown in Table I.

TABLE 1

| A | 0000 |
|---|------|
| B | 0001 |
| C | 0011 |
| D | 0010 |
| E | 0100 |
| F | 0101 |
| G | 0111 |
| H | 0110 |
| I | 1100 |
| J | 1101 |
| K | 1111 |
| L | 1110 |
| M | 1000 |
| N | 1001 |
| O | 1011 |
| P | 1010 |

The mapping is designed so that the squared Euclidean distance between any two signal points is at least 4($a^2$) times the minimum free Hamming distance of the code (which in the preferred embodiment is equal to 5). Thus $$d^2_{trellis}=20(a^2) \qquad (4)$$

which is smaller than $d^2_{parallel}$. The ratio of the free squared Euclidean distance of the coded system to the average signal energy is then 20/82=0.244. The asymptotic coding gain (ACG) of this system as compared to uncoded 64 QAM is then $$ACG=10\ \log_{10}(0.244/0.096)=4.05\ \text{dB}. \qquad (5)$$

Figure 6:
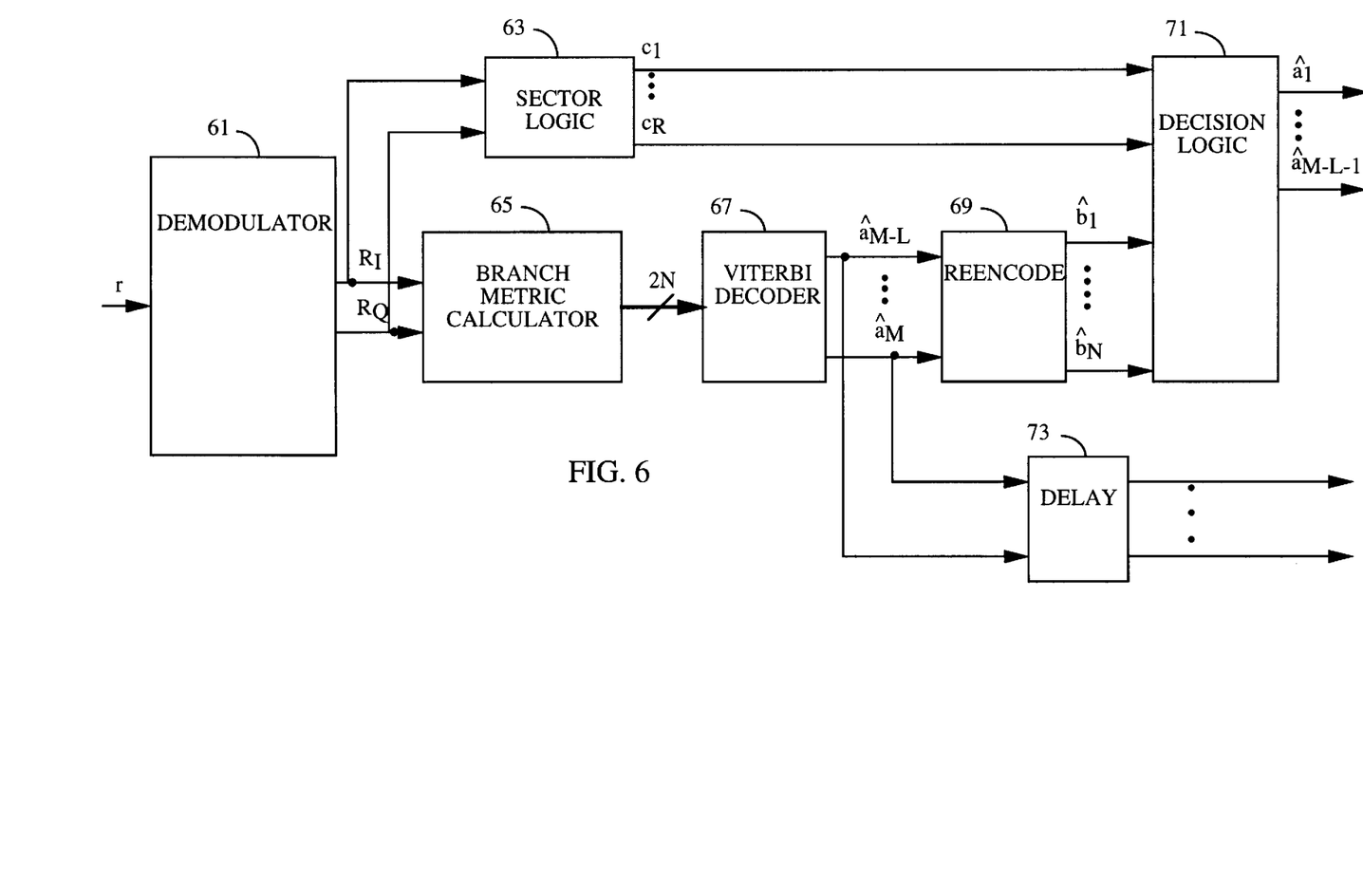
FIG. 6 is an exemplary block diagram of a QAM trellis modulated data receiver.

In FIG. 6, a receiver for decoding QAM trellis modulated data is illustrated. The received signal r is provided to QAM Demodulator 61 which demodulates the received signal to provide the signal space coordinates $R_I$ and $R_Q$, which are the I and Q components of the received signal. The signal space coordinates $R_I$ and $R_Q$ are provided to branch metric calculator 65. The branch metric calculator 65 calculates a set of metric data that is indicative of the probability of alternative hypotheses for the received versions of the coded symbols corresponding to symbols $b_1$–$b_N$ of FIG. 1. The signal space coordinates $R_I$ and $R_Q$ are also provided to sector logic element 63, which in response provides the R-bit sector number denoted $c_1$–$c_R$ corresponding to a group of signal points in the proximity of the received signal coordinates.

The branch metric data is provided to Viterbi decoder 67 that in response provides corrected estimates of the coded input bits $a_{M-L+1}$–$a_M$. The coded input bits $a_{M-L+1}$–$a_M$ are provided to reencode element 69 and delay element 73. The coded input bits $\hat{a}_{K+1}$–$\hat{a}_M$ are delayed by a predetermined time period by delay 73 before being outputted in order to provide proper time synchronization with the outputs from decision logic 71. Reencode element 69 convolutionally encodes the corrected estimates of the coded input bits $\hat{a}_{M-L+1}$–$\hat{a}_M$ in accordance with the same encoding format as encoder 2 of FIG. 1. The reencoded symbols $\hat{b}_1$–$\hat{b}_N$ along with the sector number are provided to decision logic element 71, which in response provides corrected estimates of the uncoded input data bits $\hat{a}_1$–$\hat{a}_{M-L}$.

Figure 7:
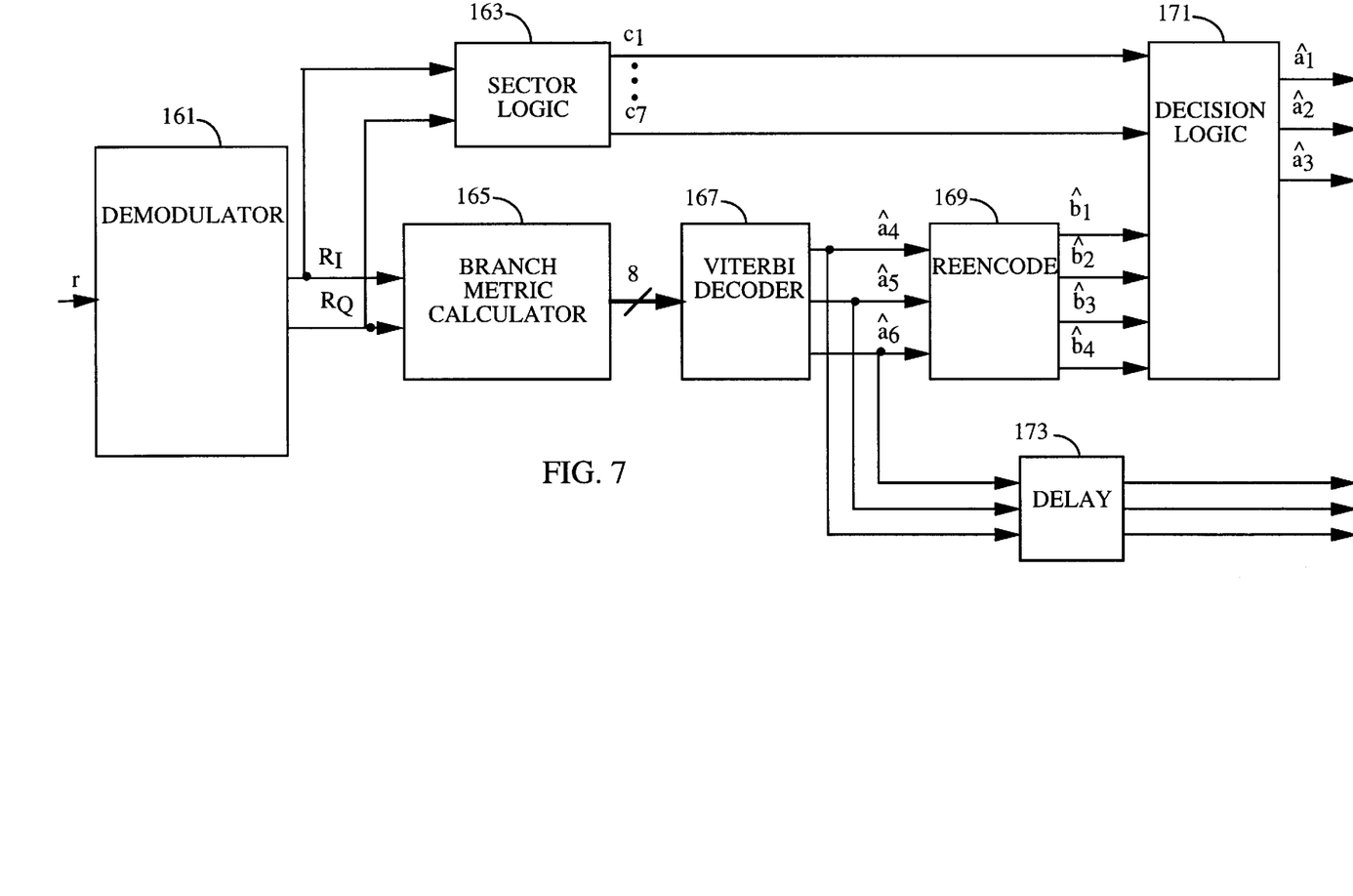
FIG. 7 is an exemplary block diagram of a 128-QAM trellis modulated data receiver.

A block diagram of an exemplary 128-QAM trellis demodulator is presented in FIG. 7. The received signal r is provided to 128-QAM demodulator 161. Demodulator 161 demodulates the received signal r to provide the I and Q components of the received signal denoted by symbols $R_I$ and $R_Q$.

The $R_I$ and $R_Q$ values are provided to sector logic element 163. Sector logic element 163 determines the sector number in accordance with the mapping illustrated in FIG. 8. The sector numbers range in value from 1 to 105, requiring seven bits of information $c_1$–$c_7$ to code them. While the Viterbi decoder is determining the values of the coded bits it is necessary to maintain information relative to the $R_I$ and $R_Q$ values, however it is not necessary to store the actual $R_I$ and $R_Q$ values. In the preferred embodiment the sector value would be stored instead of the $R_I$ and $R_Q$ values resulting in a substantial saving in the number of bits needing to be stored.

Referring back to FIG. 7, the values $R_I$ and $R_Q$ are also provided to branch metric calculator 165. Branch metric calculator 165 calculates branch metric values proportional to the likelihood of alternative received hypotheses of the possible values of the coded symbols represented in the received signal. The metric data must be stored to help in the selection of the best path through the trellis. In a preferred embodiment the branch metric data would be quantized to an integer value of less than five bits for storage purposes.

It is assumed that decoder 167 uses as an engine, a Viterbi decoder matched to the puncture rate ½ convolutional code. The branches of the trellis upon which the Viterbi decoder operates are labeled by the pairs $(b_1,b_2)$, $(b_3,X)$ and $(X,b_4)$ where X denotes the erasure symbol. Thus, prior to Viterbi decoding, the proper branch metrics for each of the values that $(b_1,b_2)$, $(b_3,X)$ or $(X,b_4)$ must be computed. The pair $R_I$ and $R_Q$ are used to obtain the four branch metrics for $(b_1,b_2)$, the two branch metrics for $(b_3,X)$ and the two branch metrics for $(X,b_4)$ and then the process repeats. The calculation of the branch metrics for $(b_1,b_2)$ is done as follows:

$$\mu(0,0) = \text{MIN}\ ((R_Q - F(A_0))^2, (R_Q - F(A_3))^2, (R_Q - F(A_5))^2) \quad (6)$$

$$\mu(0,1) = \text{MIN}\ ((R_Q - F(E_0))^2, (R_Q - F(E_3))^2, (R_Q - F(E_5))^2) \quad (7)$$

$$\mu(1,1) = \text{MIN}\ ((R_Q - F(I_0))^2, (R_Q - F(I_3))^2, (R_Q - F(I_5))^2) \quad (8)$$

$$\mu(1,0) = \text{MIN}\ ((R_Q - F(M_0))^2, (R_Q - F(M_3))^2, (R_Q - F(M_5))^2) \quad (9)$$

where $F(x)$ is the Q component of the signal point x.

That is, for each possible value of the four values that $(b_1,b_2)$ can take on, one computes the squared Euclidean distance to the closest of the three rows of signal points that corresponds to that value of $(b_1,b_2)$.

To calculate the metric for the value $(b_3,X)$, for $b_3=0$ and for $b_3=1$, one calculates the squared Euclidean distance to the closest column consistent with that hypothesis of value of $b_3$. The metrics for $(b_3,X)$ are calculated as follows:

$$\mu(0,X) = \text{MIN}\ ((R_I - W(A_0))^2, (R_I - W(B_0))^2, (R_I - W(A_1))^2, (R_I - W(B_1))^2, (R_I - W(A_2))^2, (R_I - W(B_2))^2) \quad (10)$$

$$\mu(1,X) = \text{MIN}\ ((R_I - W(C_0))^2, (R_I - W(D_0))^2, (R_I - W(C_1))^2, (R_I - W(D_1))^2, (R_I - W(C_2))^2, (R_I - W(D_2))^2) \quad (11)$$

where $W(x)$ is the I component of the signal point x.

Similarly one calculates the metrics for $(X,b_4)$ as follows:

$$\mu(X,0) = \text{MIN}\ ((R_I - W(A_0))^2, (R_I - W(D_0))^2, (R_I - W(A_1))^2, (R_I - W(D_1))^2, (R_I - W(A_2))^2, (R_I - W(D_2))^2) \quad (12)$$

$$\mu(X,1) = \text{MIN}\ ((R_I - W(B_0))^2, (R_I - W(C_0))^2, (R_I - W(B_1))^2, (R_I - W(C_1))^2, (R_I - W(B_2))^2, (R_I - W(C_2))^2) \quad (13)$$

The above discussion assumes, as is the case for the Q1875 chip, that externally generated branch metrics can be utilized by the decoder. If this is not the case, the signal space coordinates can be predistorted to artificially obtain the desired branch metrics. In the preferred configuration the branch metric data will be quantized to 3 or 4 bit integer values to reduce the amount of branch metric data that needs to be stored.

Figure 8:
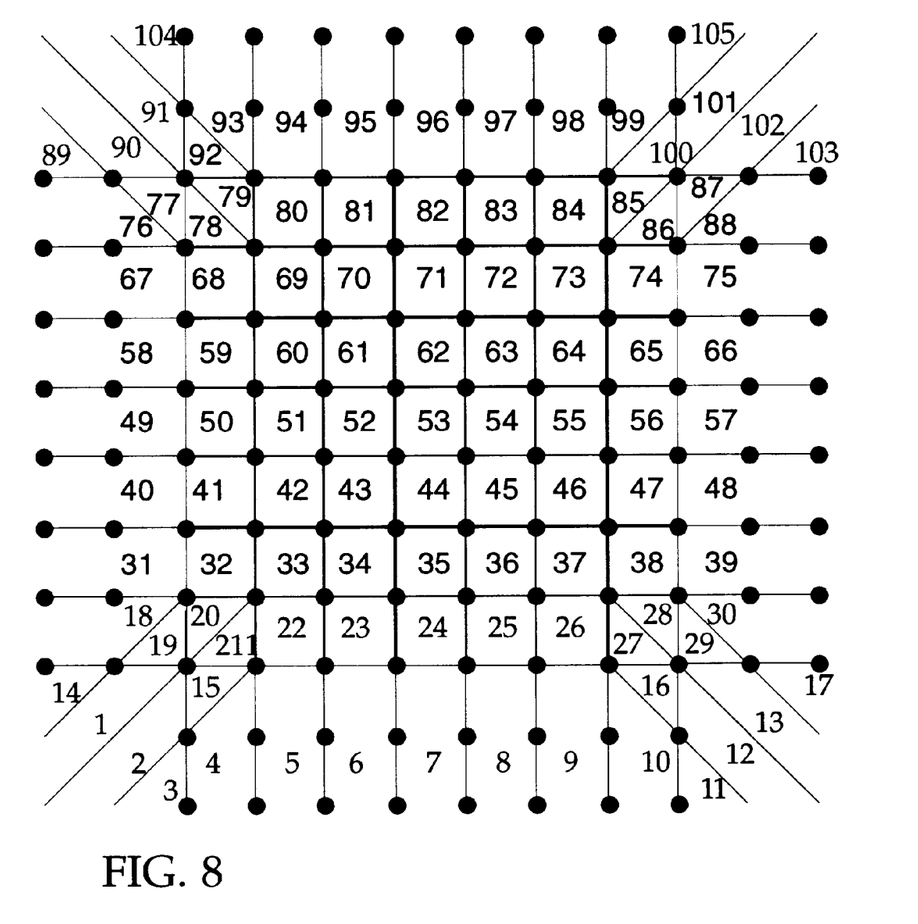
FIG. 8 is an exemplary sector partitioning of I–Q signal space for the case of 128-QAM modulation.

Since at this point in the decoding algorithm, it is not known which branches will be chosen by the Viterbi decoder, the information required to pick the best values for the uncoded digits must be stored. There are several ways to store this information. The most obvious way is to store the received $(R_I,R_Q)$ pairs. A more efficient method, as previously alluded to, is to partition the $(R_I,R_Q)$ plane into 105 sectors and store only the sector number into which the received $(R_I,R_Q)$ pair falls. This requires 7 bits for each $(R_I,R_Q)$ pair. In the exemplary implementation, the sector number defines a set of sixteen signal points in the proximity of the received signal coordinates.

The Viterbi decoder then operates to select the best path through the trellis of the rate ½ code. The output of this decoder is an estimate of the bits on line $a_4$–$a_6$. This bit stream is then re-encoded to produce the best estimate of the sequence of $(b_1,b_2)$, $(b_3,X)$ and $(X,b_4)$ values, $\hat{b}_1$–$\hat{b}_4$. The reencoded symbols $\hat{b}_1$–$\hat{b}_4$ along with the sector information $c_1$–$c_7$ is sufficient to provide a corrected estimate of the uncoded bit streams $\hat{a}_1$–$\hat{a}_3$.

It should be noted that the methods and apparatuses described in the 128QAM case are equally applicable to any QAM transmission convention. It should also be noted that the encoding and decoding strategies can be nested or placed in serial with other encoding and decoding methods and apparatuses.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

We claim:

1. An apparatus for encoding Quadrature Amplitude Modulation (QAM) trellis coded data comprising:

encoding means for receiving a subset of bits of an input data bits set and encoding said subset of bits according to a punctured convolutional encoding format based upon a lower rate convolutional code to provide a plurality of coded symbols;

QAM modulation means for providing a modulation signal in accordance with remaining uncoded input bits of said input data bits set and said coded symbols, said remaining uncoded input bits corresponding to a group of modulation signal values;

mapping means for receiving said remaining bits and said coded symbols and converting said remaining bits and said coded symbols to signal space coordinates according to a predetermined conversion format;

wherein said mapping means is further for converting said remaining bits and said coded symbols to signal space coordinates in accordance with a mapping which is a combination of Gray code mapping and signal space blocking.

2. An apparatus for encoding Quadrature Amplitude Modulation (QAM) trellis coded data comprising:

encoding means for receiving a subset of bits of an input data bits set and encoding said subset of bits according to a punctured convolutional encoding format based upon a lower rate convolutional code to provide a plurality of coded symbols;

QAM modulation means for providing a modulation signal in accordance with remaining uncoded input bits of said input data bits set and said coded symbols, said remaining uncoded input bits corresponding to a group of modulation signal values and said coded symbols corresponding to a predetermined signal value within said group of modulation signal values; and mapping means for receiving said remaining bits and said coded symbols and converting said remaining bits and said coded symbols to signal space coordinates according to a predetermined conversion format; and for converting said remaining bits and said coded symbols to signal space coordinates in accordance with a mapping which is a combination of Gray code mapping and signal space blocking.

3. The apparatus of claim 2 wherein said mapping means is further for maintaining a relation between Hamming distance and squared Euclidean distance.

4. The apparatus of claim 2 wherein said encoding means comprises a rate ¾ convolutional encoder based on a punctured rate ½ convolutional code.

5. The apparatus of claim 4 wherein said input data bit set comprises six bits.

* * * * *